United States Patent
Kimura et al.

(10) Patent No.: US 6,723,452 B2
(45) Date of Patent: Apr. 20, 2004

(54) SEMICONDUCTOR ENCAPSULATING EPOXY RESIN COMPOSITION AND SEMICONDUCTOR DEVICE

(75) Inventors: Yasuo Kimura, Gunma-ken (JP); Kazutoshi Tomiyoshi, Gunma-ken (JP); Tarou Shimoda, Gunma-ken (JP); Eiichi Asano, Gunma-ken (JP); Takayuki Aoki, Tokyo (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/196,222

(22) Filed: Jul. 17, 2002

(65) Prior Publication Data
US 2003/0050399 A1 Mar. 13, 2003

(30) Foreign Application Priority Data
Jul. 17, 2001 (JP) ........................ 2001-216735
Jul. 17, 2001 (JP) ........................ 2001-216748

(51) Int. Cl.$^7$ ............................................. H01L 29/12
(52) U.S. Cl. .................. 428/620; 523/458; 257/793; 257/795
(58) Field of Search .................. 428/620; 523/458; 257/793, 795

(56) References Cited

U.S. PATENT DOCUMENTS 6,143,423 A * 11/2000 Shiobara .................... 428/620

* cited by examiner

Primary Examiner—Robert Dawson
Assistant Examiner—D. Aylward
(74) Attorney, Agent, or Firm—Birch, Stewart, Kolasch & Birch, LLP.

(57) ABSTRACT

Epoxy resin compositions comprising (A) an epoxy resin having an epoxy equivalent of at least 185 and possessing a structure in which two benzene rings can be directly conjugated, carbon atoms having an sp$^2$ type atomic orbital accounting for at least 50% of all the carbon atoms, (B) a β-naphthol type phenolic resin curing agent, (C) a curing accelerator, and (D) an inorganic filler cure into products having satisfactory solder crack resistance on use of lead-free solder and improved flame retardance despite the absence of halogenated epoxy resins and antimony compounds and are thus suited for semiconductor encapsulation.

16 Claims, No Drawings

SEMICONDUCTOR ENCAPSULATING EPOXY RESIN COMPOSITION AND SEMICONDUCTOR DEVICE

This invention relates to an environment-friendly epoxy resin composition for semiconductor encapsulation which cures into a product having satisfactory solder crack resistance on use of lead-free solder and improved flame retardance despite the absence of halogenated epoxy resins and antimony compounds. It also relates to a semiconductor device encapsulated with a cured product of the composition.

BACKGROUND OF THE INVENTION

The current mainstream in the semiconductor industry resides in diodes, transistors, ICs, LSIs and VLSIs of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. As the environmental protection becomes important over the latest years, industrial materials are desired to be halogen- and lead-free. This is true to encapsulating agents. More severe requirements are imposed on the encapsulating materials. For example, in the manufacture of semiconductor devices, solder plating is often carried out upon mounting on boards and the plated solder films contain a substantial amount of lead. The environment protection calls for elimination of lead. However, the use of lead-free solder requires an elevated temperature for reflow, which compromises the reliability of epoxy resin encapsulants in terms of reflow resistance.

For semiconductor encapsulating epoxy resin compositions, good adhesion and low moisture absorption must be achieved before the reflow resistance can be improved. An increased loading of the inorganic filler can provide a lower moisture absorption, from which an improvement in reflow resistance is expectable, but results in a higher viscosity, detracting from the flow of the epoxy resin composition upon molding. The epoxy resin compositions are thus required to have a low melt viscosity as well. Such compositions are semi-solid or liquid and thus interfere with efficient operation.

In prior art epoxy resin compositions, halogenated epoxy resins combined with antimony trioxide ($Sb_2O_3$) are often blended in order to enhance flame retardance. This combination of a halogenated epoxy resin with antimony trioxide has great radical-trapping and air-shielding effects in the vapor phase, thus conferring a high fire-retarding effect.

However, the halogenated epoxy resins generate noxious gases during combustion, and antimony trioxide has powder toxicity. Given their negative impact on human health and the environment, it is desirable to entirely exclude these fire retardants from epoxy resin compositions.

In view of the above demand, studies have been conducted on the use of hydroxides such as $Al(OH)_3$ and $Mg(OH)_2$ or phosphorus-containing fire retardants such as red phosphorus and phosphates in place of halogenated epoxy resins and antimony trioxide. Unfortunately, various problems arise from the use of these alternative compounds. The hydroxides such as $Al(OH)_3$ and $Mg(OH)_2$ have less flame retardant effects and must be added in larger amounts in order that epoxy resin compositions be flame retardant. Then the viscosity of these compositions increases to a deleterious level to molding, causing molding defects such as voids and wire flow. The phosphorus-containing fire retardants such as red phosphorus and phosphates added to epoxy resin compositions can be hydrolyzed to generate phosphoric acid when the semiconductor devices are exposed to hot humid conditions. The phosphoric acid generated causes aluminum conductors to be corroded, detracting from reliability.

SUMMARY OF THE INVENTION

An object of the invention is to provide an epoxy resin composition for semiconductor encapsulation which cures into a product having satisfactory solder crack resistance on use of lead-free solder and improved flame retardance despite the absence of halogenated epoxy resins and antimony compounds. Another object is to provide a semiconductor device encapsulated with the composition in the cured state.

It has been found that when a specific epoxy resin is combined with a specific phenolic resin, and preferably further with a specific flame retardant, a molybdenum ingredient having zinc molybdate supported on an inorganic carrier, there is obtained an epoxy resin composition which cures into a product having satisfactory solder crack resistance on use of lead-free solder and improved flame retardance despite the absence of halogenated epoxy resins and antimony compounds such as antimony trioxide and is thus suitable for semiconductor encapsulation.

In a first aspect, the present invention provides a semiconductor encapsulating epoxy resin composition comprising (A) an epoxy resin having an epoxy equivalent of at least 185 and possessing a skeleton having at least one structure in which two benzene rings can be directly conjugated, carbon atoms having an $sp^2$ type atomic orbital accounting for at least 50% of all the carbon atoms, (B) a phenolic resin of the general formula (1) and preferably, a mixture of a phenolic resin of the general formula (1) and a phenolic resin of the general formula (2), shown below, (C) a curing accelerator, (D) an inorganic filler, and optionally, (E) a molybdenum ingredient having zinc molybdate supported on an inorganic carrier. A semiconductor device encapsulated with a cured product of the epoxy resin composition is also contemplated.

In a second aspect, the present invention provides a semiconductor encapsulating epoxy resin composition comprising (F) a modified epoxy resin obtained by converting a mixture of 4,4'-biphenol and a phenolic resin of the general formula (2) into a glycidyl product, (G) a phenolic resin of the general formula (1) and/or a phenolic resin of the general formula (2), (C) a curing accelerator, (D) an inorganic filler, and optionally, (E) a molybdenum ingredient having zinc molybdate supported on an inorganic carrier. The second epoxy resin composition is more improved in workability and fluidity. A semiconductor device encapsulated with a cured product of the epoxy resin composition is also contemplated.

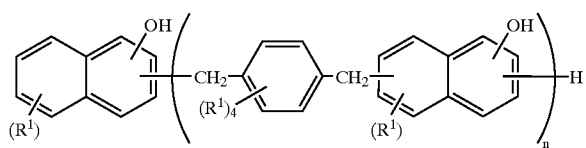

(1)

In formula (1), $R^1$ which may be the same or different is hydrogen or an alkyl group having 1 to 4 carbon atoms, and n is a natural number of 1 to 15.

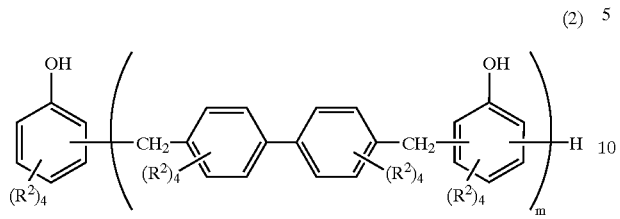
(2)

In formula (2), $R^2$ which may be the same or different is hydrogen or an alkyl group having 1 to 4 carbon atoms, and m is a natural number of 1 to 15.

DETAILED DESCRIPTION OF THE INVENTION

In the epoxy resin composition for semiconductor encapsulation according to the first embodiment of the present invention, component (A) is an epoxy resin having at least two epoxy groups per molecule and an epoxy equivalent of at least 185 and possessing a skeleton having at least one structure in which two benzene rings can be directly conjugated, in the molecular structure. Those carbon atoms having an $sp^2$ type atomic orbital account for at least 50% of all the carbon atoms. Any desired epoxy resin may be used as long as these requirements are met.

The structures in which benzene rings to construct the epoxy resin skeleton can be directly conjugated with each other typically include a biphenyl structure and a coupling of a benzene ring with a naphthalene ring or the like. When such a conjugated structure is introduced into an epoxy resin, the epoxy resin in the cured state becomes more resistant to oxidation during combustion. Those carbon atoms having an $sp^2$ type atomic orbital account for at least 50%, often 50 to 99%, preferably 54 to 95%, and more preferably 57 to 90% of all the carbon atoms.

The epoxy resin which contains no conjugated benzene rings in its skeleton and in which those carbon atoms having an $sp^2$ type atomic orbital account for less than 50% of all the carbon atoms is readily decomposable at elevated temperatures, generating gases and continuing combustion.

It has empirically been found that the epoxy resin which contains conjugated benzene rings and in which those carbon atoms having an $sp^2$ type atomic orbital account for at least 50%, often 50 to 99%, preferably 54 to 95%, and more preferably 57 to 90% of all the carbon atoms precludes combustion from continuing. To minimize the density of aliphatic bonds arising from bonding with phenolic hydroxyl groups, it is recommended to use an epoxy resin having an epoxy equivalent of at least 185, preferably 185 to 1,000, and more preferably 250 to 1,000. With an epoxy equivalent of less than 185, the aliphatic bonds formed by reaction are present in a higher density, allowing for continuation of combustion and failing to achieve the objects of the invention.

Typical epoxy resins have the structure shown below.

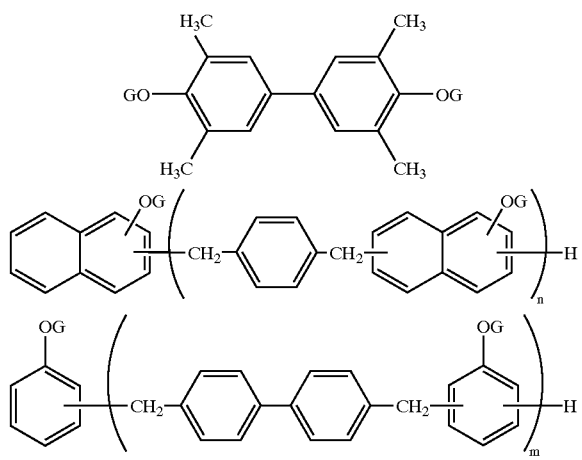

Herein G is glycidyl, n and m are such natural numbers as to provide an epoxy equivalent of at least 185.

In the practice of the invention, as the epoxy resin component, another epoxy resin may be used in combination with the specific epoxy resin (A) defined above, as long as it does not adversely affect flame retardance. The other epoxy resin used herein is not critical and may be selected from well-known epoxy resins, for example, novolac-type epoxy resins such as phenolic novolac epoxy resins and cresol novolac epoxy resins, triphenolalkane type epoxy resins such as triphenolmethane epoxy resins and triphenolpropane epoxy resins, biphenyl epoxy resins, biphenyl skeleton-free phenolaralkyl epoxy resins, heterocyclic epoxy resins, naphthalene ring-containing epoxy resins, bisphenol-type epoxy resins such as bisphenol A epoxy resins and bisphenol F epoxy resins, and stilbene epoxy resins, alone or in admixture of two or more. Of these, biphenyl epoxy resins, bisphenol A epoxy resins, bisphenol F epoxy resins, and stilbene epoxy resins are preferred by reason of a low viscosity of the melt.

In the above embodiment, the specific epoxy resin (A) is desirably used in an amount of 50 to 100% by weight, and especially 70 to 100% by weight of all the epoxy resins, that is, the specific epoxy resin (A) plus the other epoxy resins. If the proportion of the specific epoxy resin (A) is less than 50% by weight of all the epoxy resins, favorable reflow crack resistance and flame retardance may not be obtained.

Component (B) in the epoxy resin composition according to the first embodiment of the present invention is a phenolic resin of the following general formula (1) serving as a curing agent.

(1)

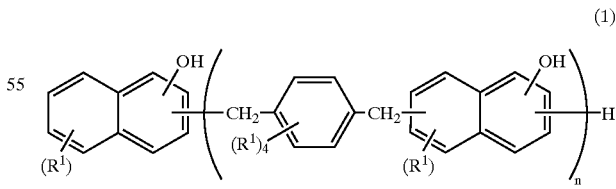

Herein $R^1$ is independently selected from hydrogen and $C_{1-4}$ alkyl groups, and may be the same or different. The subscript n is a natural number of 1 to 15, and preferably 1 to 10.

Suitable $R^1$ groups in formula (1) are hydrogen, methyl, ethyl, propyl, isopropyl, butyl, isobutyl, and tert-butyl, with hydrogen and methyl being preferred.

Preferred component (B) is a phenolic resin of formula (1) wherein the hydroxyl group on naphthol is coordinated at the β-position, that is, β-naphthol type resin. Although many α-naphthol type resins are readily susceptible to oxidation and hence substantial degradation, very difficult to work, and very poorly curable, the β-naphthol type resins do not have such problems.

The phenolic resin component (B) is preferably a mixture of the phenolic resin of formula (1) with a phenolic resin of the following general formula (2).

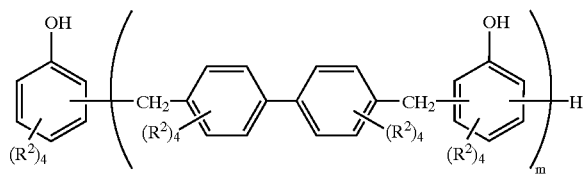

(2)

Herein $R^2$ is independently selected from hydrogen and $C_{1-4}$ alkyl groups, and may be the same or different. The subscript m is a natural number of 1 to 15 and preferably 1 to 10.

Suitable $R^2$ groups in formula (2) are hydrogen, methyl, ethyl, propyl, isopropyl, butyl, isobutyl, and tert-butyl, with hydrogen and methyl being preferred.

In the preferred embodiment wherein the phenolic resin of formula (1) is combined with the phenolic resin of formula (2), it is preferred to use the phenolic resin of formula (1) in a proportion of 30 to 70%, especially 40 to 60% by weight, and the phenolic resin of formula (2) in a proportion of 70 to 30%, especially 60 to 40% by weight, based on the total weight of the phenolic resins of formulae (1) and (2), the total being 100% by weight.

In the practice of the invention, as the phenolic resin component, another phenolic resin may be used in combination with the specific phenolic resin (B) defined above. The other phenolic resin used herein is not critical and may be selected from well-known phenolic resins, for example, novolac-type phenolic resins such as phenol novolac resins and cresol novolac resins, naphthalene ring-containing phenolic resins, biphenyl skeleton-free phenol aralkyl type phenolic resins, biphenyl phenolic resins, triphenolalkane type phenolic resins such as triphenolmethane phenolic resins and triphenolpropane phenolic resins, alicyclic phenolic resins, heterocyclic phenolic resins, and bisphenol-type phenolic resins such as bisphenol A phenolic resins and bisphenol F phenolic resins, alone or in admixture of two or more.

In the above embodiment, the phenolic resin curing agent (B), which is the phenolic resin of formula (1) and optionally, the phenolic resin of formula (2), is desirably used in an amount of 50 to 100% by weight, and especially 70 to 100% by weight of all the phenolic resin curing agents, that is, the phenolic resin (B) plus the other phenolic resins. If the proportion of the phenolic resin (B) is less than 50% by weight of all the phenolic resins, favorable reflow crack resistance and flame retardance may not be obtained.

In the practice of the invention, the epoxy resin and the phenolic resin curing agent may be blended in any desired proportion, and preferably in such a proportion that 0.5 to 1.5 moles, especially 0.8 to 1.2 moles of phenolic hydroxyl groups are available from the curing agent per mole of epoxy groups in the epoxy resin.

In the epoxy resin composition according to the second embodiment of the invention, component (F) is a modified epoxy resin obtained by converting a mixture of 4,4'-biphenol and a phenolic resin of the following general formula (2) into a glycidyl product.

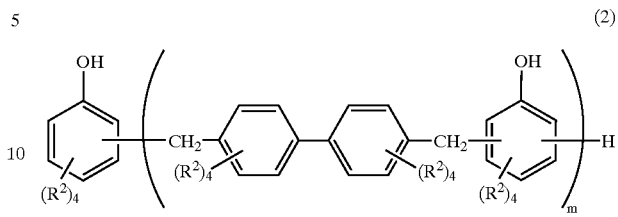

(2)

Herein $R^2$ is hydrogen or an $C_{1-4}$ alkyl group and may be the same or different, and m is a natural number of 1 to 15, preferably 1 to 10.

Suitable $R^2$ groups in formula (2) are hydrogen, methyl, ethyl, propyl, isopropyl, butyl, isobutyl, and tert-butyl, with hydrogen and methyl being preferred.

It is noted that an epoxy resin obtained by converting 4,4'-biphenol into a glycidyl form has a low viscosity and good curability, but is highly crystalline. When a glycidyl product of 4,4'-biphenol is mixed with a glycidyl product of a phenolic resin of formula (2), partial crystallization takes place. This makes it difficult for such mixing to arrive at a uniform modified epoxy resin like component (F), even if any operative means is taken. As a result, an epoxy resin composition having a low viscosity and crack resistance is not obtainable.

In the mixture of 4,4'-biphenol and the phenolic resin of formula (2) used to form the modified epoxy resin, their mixing ratio is not critical. It is preferred to use 5 to 40% by weight of 4,4'-biphenol and 95 to 60% by weight of the phenolic resin of formula (2) based on the total of 4,4'-biphenol and the phenolic resin of formula (2). With less than 5% of 4,4'-biphenol, the resulting resin may not have a low viscosity or crystallize, resulting in inefficient operation. With more than 40% of 4,4'-biphenol, the resulting resin has a low viscosity, but a reduced content of flexible moieties of formula (2), which may lead to poor solder crack resistance. The more preferred proportion of 4,4'-biphenol is 10 to 30% by weight.

In the practice of the invention, as the epoxy resin component, another epoxy resin may be used in addition to the modified epoxy resin (F) defined above. The other epoxy resin used herein is not critical and may be selected from well-known epoxy resins, for example, novolac-type epoxy resins such as phenolic novolac epoxy resins and cresol novolac epoxy resins, triphenolalkane type epoxy resins such as triphenolmethane epoxy resins and triphenolpropane epoxy resins, biphenyl epoxy resins, biphenyl skeleton-free phenolaralkyl epoxy resins, heterocyclic epoxy resins, naphthalene ring-containing epoxy resins, bisphenol-type epoxy resins such as bisphenol A epoxy resins and bisphenol F epoxy resins, and stilbene epoxy resins, alone or in admixture of two or more. Of these, biphenyl epoxy resins, bisphenol A epoxy resins, bisphenol F epoxy resins, and stilbene epoxy resins are preferred by reason of a low viscosity of the melt.

In the above embodiment, the modified epoxy resin (F) is desirably used in an amount of 50 to 100% by weight, and especially 70 to 100% by weight of all the epoxy resins, that is, the modified epoxy resin (F) plus the other epoxy resins. If the proportion of the modified epoxy resin (F) is less than 50% by weight of all the epoxy resins, favorable reflow crack resistance and flame retardance may not be obtained.

Component (G) in the epoxy resin composition according to the second embodiment of the invention is a phenolic resin of formula (1) and/or a phenolic resin of formula (2).

Again, a phenolic resin of formula (1) wherein the hydroxyl group on naphthol is coordinated at the β-position, that is, β-naphthol type resin is preferred. Although many α-naphthol type resins are readily susceptible to oxidation and hence substantial degradation, very difficult to work, and very poorly curable, the β-naphthol type resins do not have such problems.

In the second embodiment, either the phenolic resin of formula (1) or the phenolic resin of formula (2) may be used or both be used. When they are used in admixture, it is preferred to use 30 to 70% by weight of the phenolic resin of formula (1) and 70 to 30% by weight of the phenolic resin of formula (2), based on the total weight of the phenolic resins of formulae (1) and (2), the total being 100% by weight.

In the practice of the invention, as the phenolic resin component, another phenolic resin may be used in combination with the specific phenolic resin (G) defined above. The other phenolic resin used herein is not critical and may be selected from well-known phenolic resins, for example, novolac-type phenolic resins such as phenol novolac resins and cresol novolac resins, naphthalene ring-containing phenolic resins, biphenyl skeleton-free phenol aralkyl type phenolic resins, biphenyl phenolic resins, triphenolalkane type phenolic resins such as triphenolmethane phenolic resins and triphenolpropane phenolic resins, alicyclic phenolic resins, heterocyclic phenolic resins, and bisphenol-type phenolic resins such as bisphenol A phenolic resins and bisphenol F phenolic resins, alone or in admixture of two or more.

In the above embodiment, the phenolic resin curing agent (G), which is the phenolic resin of formula (1) and/or the phenolic resin of formula (2), is desirably used in an amount of 50 to 100% by weight, and especially 70 to 100% by weight of all the phenolic resin curing agents, that is, the phenolic resin (G) plus the other phenolic resins. If the proportion of the phenolic resin (G) is less than 50% by weight of all the phenolic resins, favorable reflow crack resistance and flame retardance may not be obtained.

In the second embodiment of the invention, the epoxy resin and the phenolic resin curing agent may be blended in any desired proportion, and preferably in such a proportion that 0.5 to 1.5 moles, especially 0.8 to 1.2 moles of phenolic hydroxyl groups are available from the curing agent per mole of epoxy groups in the epoxy resin.

The description of the following components is common to the first and second embodiments of the invention.

Further included in the epoxy resin compositions is (C) a curing accelerator. The curing accelerator may be selected from well-known ones commonly used in epoxy encapsulants as long as it promotes the curing reaction between epoxy groups and functional groups in the curing agent. Illustrative, non-limiting examples of curing accelerators that may be used include organic phosphorus compounds such as triphenylphosphine, tributylphosphine, tri(p-methylphenyl)phosphine, tri(nonylphenyl)phosphine, triphenylphosphine triphenylborane, and tetraphenylphosphonium tetraphenylborate; tertiary amine compounds such as triethylamine, benzyldimethylamine, α-methylbenzyl-dimethylamine, and 1,8-diazabicyclo [5.4.0]undecene-7; and imidazole compounds such as 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxy- methylimidazole.

Desirably, the curing accelerator is blended in an amount of about 0.001 to 10 parts, more desirably about 0.005 to 5 parts, and most desirably about 0.01 to 3 parts by weight per 100 parts by weight of the epoxy resin and the curing agent combined. Less than 0.001 part of the curing accelerator may be ineffective for promoting cure whereas more than 10 parts of the curing accelerator provides good cure at the sacrifice of storage stability.

The inorganic filler (D) included in the epoxy resin compositions of the invention may be any suitable inorganic filler commonly used in epoxy resin compositions. Illustrative examples include silicas such as fused silica and crystalline silica, alumina, silicon nitride, aluminum nitride, boron nitride, titanium oxide, and glass fibers.

No particular limit is imposed on the mean particle size and shape of these inorganic fillers as well as the amount thereof. To enhance the solder crack resistance on use of lead-free solder and the flame retardance, the inorganic filler is preferably contained in the epoxy resin composition in a larger amount insofar as this does not compromise moldability. With respect to the mean particle size and shape of the inorganic filler, spherical fused silica having a mean particle size of 3 to 30 μm, especially 5 to 20 μm is preferred. The amount of the inorganic filler loaded is preferably 400 to 1,200 parts by weight per 100 parts by weight of the epoxy resin and the curing agent (phenolic resin) combined. It is noted that the mean particle size is determined as the weight average value or median diameter, using a particle size distribution measuring instrument based on laser diffraction.

The inorganic filler used herein is preferably surface treated beforehand with a coupling agent such as a silane coupling agent or a titanate coupling agent in order to increase the bonding strength between the resin and the inorganic filler. Preferred examples of such coupling agents include epoxy functional alkoxysilanes such as γ-glycidoxypropyltrimethoxysilane, γ-glycidoxypropyl-methyl-diethoxysilane, and β-(3,4-epoxycyclohexyl)ethyltrimethoxy-silane; amino functional alkoxysilanes such as N-β-(aminoethyl)-γ-aminopropyltrimethoxysilane, γ-aminopropyltriethoxysilane, and N-phenyl-γ-aminopropyltrimethoxysilane; and mercapto functional alkoxysilanes such as γ-mercaptopropyltrimethoxysilane. No particular limitation is imposed on the amount of coupling agent used for surface treatment or the method of surface treatment.

The inventive epoxy resin compositions have inorganic filler loadings of preferably 400 to 1,200 parts by weight, and more preferably 600 to 900 parts by weight per 100 parts by weight of the epoxy resin and the curing agent (phenolic resin) combined. At less than 400 parts by weight of the filler, the epoxy resin composition may have a large coefficient of expansion, resulting in greater stress on the semiconductor device and a decline in the device characteristics. Moreover, the proportion of resin relative to the overall composition becomes larger, sometimes failing to attain the fire retardance that is the object of this invention. On the other hand, more than 1,200 parts by weight of the inorganic filler may result in an excessive rise in viscosity during molding and thus impede molding. The content of inorganic filler within the epoxy resin composition is preferably 75 to 92% by weight, and especially 83 to 90% by weight.

It is noted that when an inorganic filler carrying zinc molybdate thereon, to be described below, is blended, the above-referred content of the inorganic filler is inclusive of this inorganic filler as the carrier.

Preferably the epoxy resin composition of the invention contains (E) a molybdenum ingredient having zinc molybdate supported on an inorganic filler as the flame retardant.

To develop satisfactory flame retarding effects, zinc molybdate should preferably be uniformly dispersed in the epoxy resin composition. For improving the dispersion, the molybdenum ingredient having zinc molybdate supported on an inorganic filler such as silica or talc is optimum. Suitable inorganic fillers on which zinc molybdate is supported include silicas such as fused silica and crystalline silica, talc, alumina, silicon nitride, aluminum nitride, boron nitride, titanium oxide, and glass fibers. The inorganic filler should preferably have a mean particle size of 0.1 to 40 $\mu$m, and more preferably 0.5 to 15 $\mu$m and a specific surface area of 0.5 to 50 m$^2$/g, and more preferably 0.7 to 10 m$^2$/g. It is noted that the mean particle size can be determined as the weight average value or median diameter by the laser light diffraction technique, for example, and the specific surface area is determined by the BET adsorption method, for example.

In the molybdenum ingredient having zinc molybdate supported on the inorganic filler, the content of zinc molybdate is preferably 5 to 40% by weight, more preferably 10 to 30% by weight. Less contents of zinc molybdate may fail to provide satisfactory flame retardance whereas excessive contents may detract from flow during molding and curability.

The molybdenum ingredient in the form of zinc molybdate on inorganic filler is commercially available under the trade name of KEMGARD 1261, 911C and 911B from Sherwin-Williams Co.

An appropriate amount of the molybdenum ingredient blended is 3 to 120 parts, preferably 3 to 100 parts, more preferably 5 to 100 parts by weight per 100 parts by weight of the epoxy resin and the curing agent (phenolic resin) combined. Less than 3 parts may fail to provide satisfactory flame retardance whereas more than 120 parts may detract from flow and curability.

The molybdenum ingredient comprising zinc molybdate supported on inorganic filler is added in such amounts that 0.1 to 40 parts, especially 0.2 to 40 parts by weight of zinc molybdate is present per 100 parts by weight of the epoxy resin and the curing agent (phenolic resin) combined. Less than 0.1 part by weight of zinc molybdate may fail to provide satisfactory flame retardance whereas more than 40 parts by weight of zinc molybdate may detract from flow and curability.

The epoxy resin compositions of the invention may also include various additives, if necessary. Illustrative examples include stress-lowering additives such as thermoplastic resins, thermoplastic elastomers, synthetic organic rubbers, and silicones; waxes such as carnauba wax; colorants such as carbon black; and halogen trapping agents.

The inventive epoxy resin compositions may be prepared as a molding material by compounding the epoxy resin, phenolic resin, and other components in predetermined proportions, thoroughly mixing these components together in a mixer or other appropriate apparatus, then melting and working the resulting mixture using a hot roll mill, kneader, extruder or the like. The worked mixture is then cooled and solidified, and subsequently ground to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 185° C. for a period of about 30 to 180 seconds, followed by postcuring at about 150 to 185° C. for about 2 to 20 hours.

EXAMPLE

Examples of the invention and comparative examples are given below by way of illustration, and are not intended to limit the invention. All parts are by weight.

Examples 1–5 and Comparative Examples 1–5

Epoxy resin compositions for semiconductor encapsulation were prepared by uniformly melt mixing the components shown in Table 1 in a hot twin-roll mill, followed by cooling and grinding. The starting materials used herein are described below.

Epoxy Resin
  (a) biphenyl aralkyl type epoxy resin: NC3000 (Nippon Kayaku K.K., epoxy equivalent 278)
  (b) biphenyl type epoxy resin: YX4000HK (Yuka Shell K.K., epoxy equivalent 190)
  (c) o-cresol novolac type epoxy resin: EOCN-1020 (Nippon Kayaku K.K., epoxy equivalent 200)

Phenolic Curing Agent
  (d) biphenyl aralkyl resin of formula (3) shown below: MEH-7851SS (Meiwa Chemicals K.K., phenol equivalent 203)
  (e) α-naphthol aralkyl resin of formula (4) shown below
  (f) β-naphthol aralkyl resin of formula (5) shown below
  (g) phenol aralkyl resin: MEH-7800SS (Meiwa Chemicals K.K., phenol equivalent 175)

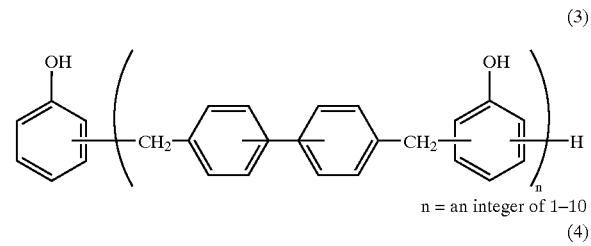

(3)

n = an integer of 1–10

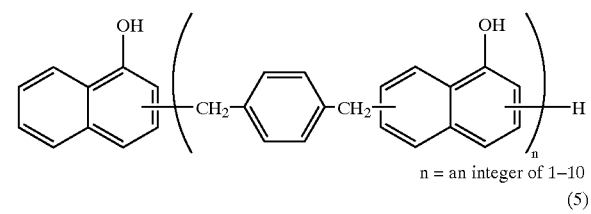

(4)

n = an integer of 1–10

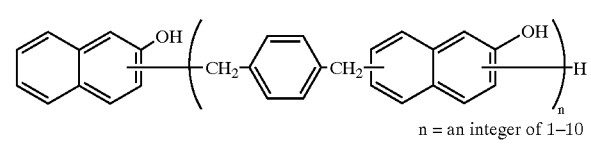

(5)

n = an integer of 1–10

Curing Accelerator
  triphenyl phosphine by Hokko Chemical K.K.
Inorganic Filler
  Spherical fused silica by Tatsumori K.K.
Molybdenum Ingredient
  Zinc molybdate KEMGARD 911B (by Sherwin-Williams Co., zinc molybdate content: 18 wt %, core material: talc, mean particle size: 2.0 $\mu$m, specific surface area: 2.0 m$^2$/g)

Parting Agent

Carnauba wax by Nikko Fine Products K.K.

Silane Coupling Agent

KBM403 (γ-glycidoxypropyltrimethoxysilane by Shin-Etsu Chemical Co., Ltd.)

Ion Trapping Agent

Hydrotalcite DHT-4A-2 by Kyowa Chemical Industry K.K.

Properties of these compositions were measured by the following methods. The results are shown in Table 1.

Spiral Flow

Measured by molding at 175° C. and 7.0 N/mm$^2$ for a molding time of 120 seconds using a mold in accordance with EMMI standards.

Gel Time

The gel time was measured as the time until the epoxy resin composition gelled on a hot plate at 175° C.

Melt Viscosity

Using a Koka-type (constant-load orifice-type) flow tester, the melt viscosity was measured at 175° C. under a load of 98 N and through a nozzle of 1 mm diameter.

Moisture Pickup

A disc having a diameter of 50 mm and a thickness of 3 mm was molded at 175° C. and 7.0 N/mm$^2$ for 2 minutes and post-cured at 180° C. for 4 hours. The disc was held in a thermostat chamber at 85° C. and RH 85% for 168 hours before the amount of water absorbed was measured.

Lead-Free Solder Cracking Resistance (1)

Using an automatic molding apparatus, a flat package of 14×20×2.7 mm was molded at 175° C. and 7.0 N/mm$^2$ from an epoxy resin composition. It was post-cured at 180° C. for 4 hours, allowed to stand in a thermostat chamber at 85° C. and RH 60% for 168 hours for moisture absorption, and immersed in a solder bath at a temperature of 260° C. for 30 seconds. Using a ultrasonic flaw detector, the package was observed to inspect whether internal cracks occurred and whether the leads were separated.

Lead-Free Solder Cracking Resistance (2)

Using an automatic molding apparatus, a flat package of 14×20×2.7 mm was molded at 175° C. and 7.0 N/mm$^2$ from an epoxy resin composition. It was post-cured at 180° C. for 4 hours, allowed to stand in a thermostat chamber at 85° C. and RH 85% for 168 hours for moisture absorption, and immersed in a solder bath at a temperature of 260° C. for 30 seconds. Using a ultrasonic flaw detector, the package was observed to inspect whether internal cracks occurred and whether the leads were separated.

Flame Retardance

A sheet of 1.5875 mm (1/16 inch) thick was molded and its flame retardance was rated in accordance with UL-94 vertical burning test specifications. ΣF is a total flaming time (sec) and Fmax is a maximum flaming time (sec).

TABLE 1

| Components (pbw) | Example | | | | | Comparative Example | | | | |
| --- | --- | --- | --- | --- | --- | --- | --- | --- | --- | --- |
| | 1 | 2 | 3 | 4 | 5 | 1 | 2 | 3 | 4 | 5 |
| Epoxy resin | | | | | | | | | | |
| (a) | 56.6 | 56.6 | 58.6 | | | 60.9 | | | | |
| (b) | | | | 47.6 | 49.6 | | 52.1 | | | |
| (c) | | | | | | | | 53.3 | 49.0 | 49.0 |
| Phenolic resin | | | | | | | | | | |
| (d) | 21.7 | 21.7 | 20.7 | 26.2 | 25.2 | | | | 25.5 | 25.5 |
| (e) | 21.7 | 21.7 | | 26.2 | | | | | 25.5 | 25.5 |
| (f) | | | 20.7 | | 25.2 | | | | | |
| (g) | | | | | | 39.1 | 47.9 | 46.7 | | |
| Inorganic filler | 800 | 800 | 800 | 900 | 900 | 800 | 900 | 800 | 800 | 800 |
| Curing accelerator | 1.5 | 1.5 | 1.5 | 1.5 | 1.5 | 1.5 | 1.5 | 1.5 | 1.5 | 1.5 |
| Molybdenum ingredient | | 10 | 10 | 10 | 10 | 10 | 10 | 10 | 10 | |
| Wax | 2.5 | 2.5 | 2.5 | 2.5 | 2.5 | 2.5 | 2.5 | 2.5 | 2.5 | 2.5 |
| Silane coupling agent | 2 | 2 | 2 | 2 | 2 | 2 | 2 | 2 | 2 | 2 |
| Ion trapping agent | 5 | 5 | 5 | 5 | 5 | 5 | 5 | 5 | 5 | 5 |
| Spiral flow, inch | 33 | 32 | 35 | 35 | 36 | 31 | 34 | 30 | 27 | 28 |
| Gel time, sec | 13 | 13 | 13 | 15 | 15 | 12 | 14 | 12 | 12 | 12 |
| Melt viscosity, Pa · s | 20 | 21 | 18 | 18 | 16 | 18 | 15 | 21 | 25 | 25 |
| Moisture pickup, % | 0.12 | 0.11 | 0.1 | 0.16 | 0.15 | 0.16 | 0.22 | 0.31 | 0.28 | 0.28 |
| Solder crack resistance (1), defectives | 0/20 | 0/20 | 0/20 | 0/20 | 0/20 | 9/20 | 12/20 | 20/20 | 20/20 | 20/20 |
| Solder crack resistance (2), defectives | 0/20 | 0/20 | 0/20 | 2/20 | 2/20 | 13/20 | 15/20 | 20/20 | 20/20 | 20/20 |
| Flame retardance rating | V-0 | V-0 | V-0 | V-0 | V-0 | V-0 | V-0 | burned up | V-1 | burned up |
| ΣF, sec | 36 | 18 | 20 | 31 | 30 | 35 | 40 | — | 68 | — |
| Fmax, sec | 8 | 5 | 6 | 7 | 7 | 8 | 9 | — | 18 | — |

Examples 6–10 and Comparative Examples 6–11

Epoxy resin compositions for semiconductor encapsulation were prepared by uniformly melt mixing the components shown in Table 2 in a hot twin-roll mill, followed by cooling and grinding. The starting materials used herein are described below.

Epoxy Resin (a) a glycidyl product of a mixture of 4,4'-biphenol and a phenolic resin of formula (3) shown below (phenol equivalent 203) in a weight ratio of 1:4

(b) biphenyl type epoxy resin: YX4000HK (Yuka Shell K.K., epoxy equivalent 190)

(c) biphenyl aralkyl type epoxy resin: NC3000 (Nippon Kayaku K.K., epoxy equivalent 278)

Phenolic Curing Agent (d) biphenyl aralkyl resin of formula (3) shown below: MEH-7851SS (Meiwa Chemicals K.K., phenol equivalent 203)

(e) α-naphthol aralkyl resin of formula (4) shown below (f) β-naphthol aralkyl resin of formula (5) shown below (g) phenol aralkyl resin: MEH-7800SS (Meiwa Chemicals K.K., phenol equivalent 175)

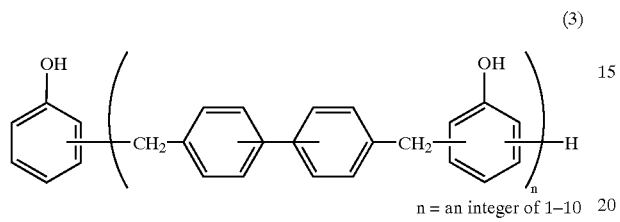

(3)

n = an integer of 1–10

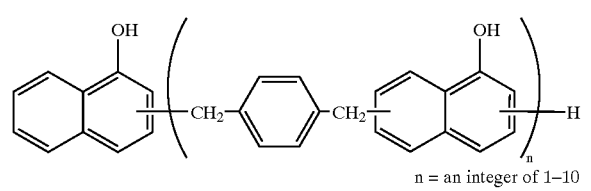

(4)

n = an integer of 1–10

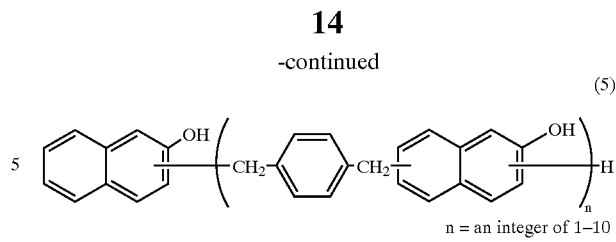

(5)

n = an integer of 1–10

Curing Accelerator
  triphenyl phosphine by Hokko Chemical K.K.
Inorganic Filler
  Spherical fused silica by Tatsumori K.K.
Molybdenum Ingredient
  Zinc molybdate KEMGARD 911B (by Sherwin-Williams Co.,
  zinc molybdate content: 18 wt %, core material: talc,
  mean particle size: 2.0 $\mu$m, specific surface area: 2.0 m$^2$/g)
Parting Agent
  Carnauba wax by Nikko Fine Products K.K.
Silane Coupling Agent
  KBM403 (γ-glycidoxypropyltrimethoxysilane by Shin-Etsu Chemical Co., Ltd.)
Ion Trapping Agent
  Hydrotalcite DHT-4A-2 by Kyowa Chemical Industry K.K.

Properties of these compositions were measured as in Examples 1–5, with the results shown in Table 2.

TABLE 2

| Components (pbw) | Example | | | | | Comparative Example | | | | | |
|---|---|---|---|---|---|---|---|---|---|---|---|
| | 6 | 7 | 8 | 9 | 10 | 6 | 7 | 8 | 9 | 10 | 11 |
| Epoxy resin | | | | | | | | | | | |
| (a) | 55.2 | 57.8 | 57.8 | 56.5 | 56.5 | | | | 56.1 | | |
| (b) | | | | | | 49.7 | 49.7 | | | 52.1 | |
| (c) | | | | | | | | 57 | | | 60.9 |
| Phenolic resin | | | | | | | | | | | |
| (d) | 44.8 | | | 21.7 | 21.7 | 25.2 | 25.2 | 21.5 | | | |
| (e) | | 42.2 | | | | | | | | | |
| (f) | | | 42.2 | 21.7 | 21.7 | 25.2 | 25.2 | 21.5 | | | |
| (g) | | | | | | | | | 43.9 | 47.9 | 39.1 |
| Inorganic filler | 800 | 800 | 800 | 800 | 800 | 800 | 900 | 800 | 800 | 800 | 800 |
| Curing accelerator | 1.5 | 1.5 | 1.5 | 1.5 | 1.5 | 1.5 | 1.5 | 1.5 | 1.5 | 1.5 | 1.5 |
| Molybdenum ingredient | 10 | 10 | 10 | 10 | 10 | 10 | 10 | 10 | 10 | 10 | 10 |
| Wax | 2.5 | 2.5 | 2.5 | 2.5 | 2.5 | 2.5 | 2.5 | 2.5 | 2.5 | 2.5 | 2.5 |
| Silane coupling agent | 2 | 2 | 2 | 2 | 2 | 2 | 2 | 2 | 2 | 2 | 2 |
| Ion trapping agent | 5 | 5 | 5 | 5 | 5 | 5 | 5 | 5 | 5 | 5 | 5 |
| Spiral flow, inch | 45 | 42 | 42 | 44 | 44 | 46 | 36 | 35 | 40 | 46 | 31 |
| Gel time, sec | 14 | 17 | 14 | 14 | 14 | 16 | 13 | 13 | 12 | 12 | 12 |
| Melt viscosity, Pa · s | 10 | 13 | 13 | 12 | 12 | 10 | 19 | 18 | 13 | 9 | 18 |
| Moisture pickup, % | 0.12 | 0.1 | 0.09 | 0.1 | 0.1 | 0.16 | 0.12 | 0.11 | 0.21 | 0.25 | 0.16 |
| Solder crack resistance (1), defectives | 0/20 | 0/20 | 0/20 | 0/20 | 0/20 | 9/20 | 0/20 | 0/20 | 15/20 | 20/20 | 9/20 |
| Solder crack resistance (2), defectives | 2/20 | 2/20 | 2/20 | 0/20 | 0/20 | 16/20 | 2/20 | 0/20 | 20/20 | 20/20 | 13/20 |
| Flame retardance rating | V-0 | V-0 | V-0 | V-0 | V-0 | V-1 | V-0 | V-0 | V-1 | burned up | V-0 |
| ΣF, sec | 18 | 22 | 21 | 20 | 30 | 61 | 30 | 20 | 45 | — | 35 |
| Fmax, sec | 5 | 7 | 7 | 6 | 8 | 16 | 7 | 6 | 11 | — | 8 |

There has been described an epoxy resin composition for semiconductor encapsulation which cures into a product having satisfactory solder crack resistance on use of lead-free solder and improved flame retardance despite the absence of halogenated epoxy resins and antimony compounds. Semiconductor devices encapsulated with the composition in the cured state are of great worth in the industry.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating epoxy resin composition comprising
   (A) an epoxy resin having an epoxy equivalent of at least 185 and possessing a skeleton having at least one structure in which two benzene rings can be directly conjugated, carbon atoms having an $sp^2$ type atomic orbital accounting for at least 50% of all the carbon atoms,
   (B) a phenolic resin of the following general formula (1):

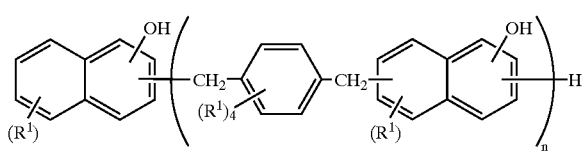

(1)

wherein $R^1$ which may be the same or different is hydrogen or an alkyl group having 1 to 4 carbon atoms, and n is a natural number of 1 to 15,
   (C) a curing accelerator,
   (D) an inorganic filler, and
   (E) a molybdenum ingredient having zinc molybdate supported on an inorganic filler.

2. The epoxy resin composition of claim 1 wherein component (B) is the phenolic resin of the general formula (1) in admixture with a phenolic resin of the following general formula (2):

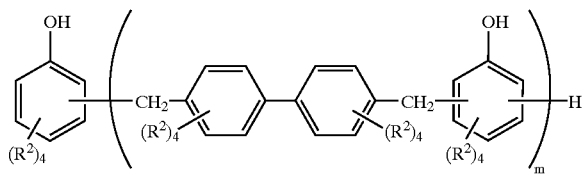

(2)

wherein $R^2$ which may be the same or different is hydrogen or an alkyl group having 1 to 4 carbon atoms, and m is a natural number of 1 to 15.

3. The epoxy resin composition of claim 1 wherein component (B) is a β-naphthol type resin of formula (1) wherein the hydroxyl group on naphthol is coordinated at the β-position.

4. A semiconductor encapsulating epoxy resin composition comprising
   (F) a modified epoxy resin obtained by glycidyl-converting a mixture of 4,4'-biphenol and a phenolic resin of the following general formula (2):

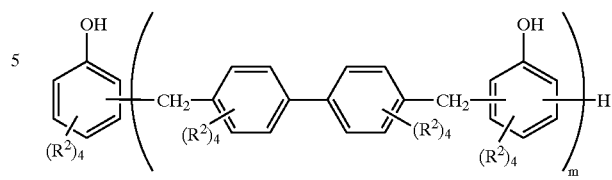

(2)

wherein $R^2$ which may be the same or different is hydrogen or an alkyl group having 1 to 4 carbon atoms, and m is a natural number of 1 to 15,
   (G) a phenolic resin of the following general formula (1):

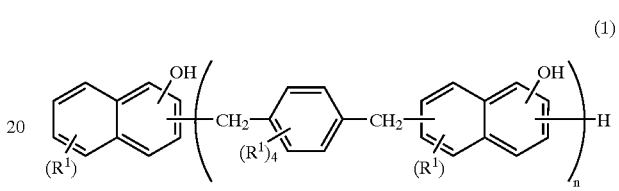

(1)

wherein $R^1$ which may be the same or different is hydrogen or an alkyl group having 1 to 4 carbon atoms, and n is a natural number of 1 to 15, and/or a phenolic resin of the general formula (2),
   (C) a curing accelerator, and
   (D) an inorganic filler.

5. The epoxy resin composition of claim 4 wherein component (G) is a β-naphthol type resin of formula (1) wherein the hydroxyl group on naphthol is coordinated at the β-position.

6. The epoxy resin composition of claim 4, further comprising (E) a molybdenum ingredient having zinc molybdate supported on an inorganic filler.

7. A semiconductor device encapsulated with a cured product of the epoxy resin composition of claim 1.

8. A semiconductor device encapsulated with a cured product of the epoxy resin composition of claim 4.

9. The epoxy resin composition of claim 1, wherein component (A) is an epoxy resin having an epoxy equivalent of 250 to 1000 and possessing a skeleton having at least one structure in which two benzene rings can be directly conjugated, carbon atoms having an $sp^2$ type atomic orbital accounting for 57–90% of all the carbon atoms.

10. The epoxy resin composition of claim 1, wherein the ratio of epoxy resin (A) to phenolic resin (B) is such that 0.8 to 1.2 mols of phenolic hydroxyl groups are available from curing agent (B) per mole of epoxy groups in epoxy resin (A).

11. The epoxy resin composition of claim 1, wherein curing accelerator (C) is triphenyl phosphine.

12. The epoxy resin composition of claim 1, wherein inorganic filler (D) is silica.

13. The epoxy resin composition of claim 4, wherein, in modified epoxy resin (F), each $R^2$ is hydrogen or methyl and m is 1 to 10.

14. The epoxy resin composition of claim 4, wherein the ratio of epoxy resin (F) to phenolic resin (G) is such that 0.8 to 1.2 mols of phenolic hydroxyl groups are available from curing agent (G) per mole of epoxy groups in epoxy resin (A).

15. The epoxy resin composition of claim 4, wherein curing accelerator (C) is triphenyl phosphine.

16. The epoxy resin composition of claim 4, wherein inorganic filler (D) is silica.

* * * * *